(12) United States Patent
Shah et al.

(10) Patent No.: US 7,208,361 B2
(45) Date of Patent: Apr. 24, 2007

(54) REPLACEMENT GATE PROCESS FOR MAKING A SEMICONDUCTOR DEVICE THAT INCLUDES A METAL GATE ELECTRODE

(75) Inventors: Uday Shah, Portland, OR (US); Chris E. Barns, Portland, OR (US); Mark L. Doczy, Beaverton, OR (US); Justin K. Brask, Portland, OR (US); Jack Kavalieros, Portland, OR (US); Matthew V. Metz, Hillsboro, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 259 days.

(21) Appl. No.: 10/809,853

(22) Filed: Mar. 24, 2004

(65) Prior Publication Data
US 2005/0214987 A1 Sep. 29, 2005

(51) Int. Cl.
*H01L 21/8238* (2006.01)
*H01L 27/10* (2006.01)

(52) U.S. Cl. .................. 438/199; 438/230; 438/303; 438/595; 257/204; 257/412; 257/E21.626; 257/E21.632; 257/E21.64

(58) Field of Classification Search .................... None
See application file for complete search history.

(56) References Cited

U.S. PATENT DOCUMENTS

| 4,128,845 | A | * | 12/1978 | Sakai | 257/588 |
|---|---|---|---|---|---|
| 5,342,481 | A | * | 8/1994 | Kadomura | 216/46 |
| 5,834,816 | A | * | 11/1998 | Jang | 257/382 |
| 5,880,033 | A | * | 3/1999 | Tsai | 438/710 |
| 6,018,179 | A | * | 1/2000 | Gardner et al. | 257/336 |
| 6,060,375 | A | * | 5/2000 | Owyang et al. | 438/585 |
| 6,063,698 | A | | 5/2000 | Tseng et al. | 438/585 |
| 6,171,910 | B1 | * | 1/2001 | Hobbs et al. | 438/275 |
| 6,184,072 | B1 | | 2/2001 | Kaushik et al. | 438/197 |
| 6,242,312 | B1 | * | 6/2001 | Huang et al. | 438/305 |
| 6,255,698 | B1 | | 7/2001 | Gardner et al. | 257/369 |
| 6,352,867 | B1 | * | 3/2002 | Couteau et al. | 438/8 |
| 6,365,450 | B1 | | 4/2002 | Kim | 438/216 |
| 6,410,376 | B1 | | 6/2002 | Ng et al. | 438/199 |
| 6,420,279 | B1 | | 7/2002 | Ono et al. | 438/785 |
| 6,433,371 | B1 | * | 8/2002 | Scholer et al. | 257/288 |

(Continued)

FOREIGN PATENT DOCUMENTS

EP  0 899 784 AZ  3/1999

(Continued)

OTHER PUBLICATIONS

Polishchuk et al., "Dual Workfunction CMOS Gate Technology Based on Metal Interdiffusion", www.eesc.berkeley.edu, 1 page.

(Continued)

*Primary Examiner*—Alonzo Chambliss

(57) ABSTRACT

A method for making a semiconductor device is described. That method comprises forming a polysilicon layer on a dielectric layer, which is formed on a substrate. The polysilicon layer is etched to generate a patterned polysilicon layer with an upper surface that is wider than its lower surface. The method may be applied, when using a replacement gate process to make transistors that have metal gate electrodes.

20 Claims, 4 Drawing Sheets

U.S. PATENT DOCUMENTS

| | | | |
|---|---|---|---|
| 6,475,874 B2 | 11/2002 | Xiang et al. | 438/396 |
| 6,514,828 B2 | 2/2003 | Ahn et al. | 438/240 |
| 6,544,906 B2 | 4/2003 | Rotondaro et al. | 438/785 |
| 6,586,288 B2 | 7/2003 | Kim et al. | 438/183 |
| 6,617,209 B1 | 9/2003 | Chau et al. | 438/240 |
| 6,617,210 B1 | 9/2003 | Chau et al. | 438/240 |
| 6,620,713 B2 | 9/2003 | Arghavani et al. | 438/585 |
| 6,635,922 B1 * | 10/2003 | Hsieh et al. | 257/317 |
| 6,642,131 B2 | 11/2003 | Harada | 438/591 |
| 6,667,246 B2 | 12/2003 | Mitsuhashi et al. | 438/756 |
| 6,689,675 B1 | 2/2004 | Parker et al. | 438/585 |
| 6,696,327 B1 | 2/2004 | Brask et al. | 438/197 |
| 6,696,345 B2 | 2/2004 | Chau et al. | 438/387 |
| 6,743,683 B2 * | 6/2004 | Barns et al. | 438/299 |
| 6,784,491 B2 * | 8/2004 | Doyle et al. | 257/346 |
| 6,995,434 B2 * | 2/2006 | Usui et al. | 257/368 |
| 2002/0058374 A1 | 5/2002 | Kim et al. | 438/228 |
| 2002/0197790 A1 | 12/2002 | Kitzilyalli et al. | 438/240 |
| 2003/0032303 A1 | 2/2003 | Yu et al. | 438/770 |
| 2003/0045080 A1 | 3/2003 | Visokay et al. | 438/591 |

FOREIGN PATENT DOCUMENTS

| | | |
|---|---|---|
| GB | 2 358 737 A | 4/2001 |

OTHER PUBLICATIONS

Doug Barlage et al., "High-Frequency Response of 100nm Integrated CMOS Transistors with High-K Gate Dielectrics", 2001 IEEE, 4 pages.

Lu et al., "Dual-Metal Gate Technology for Deep-Submicron CMOS Devices", dated Apr. 29, 2003, 1 page.

Schwantes et al., "Performance Improvement of Metal Gate CMOS Technologies with Gigabit Feature Sizes", Technical University of Hanburg-Harburg, 5 pages.

Doczy et al., "Integrating N-type and P-type Metal Gate Transistors," U.S. Appl. No. 10/327,293, filed Dec. 20, 2002.

Brask et al., "A Method for Making a Semiconductor Device Having a Metal Gate Electrode," U.S. Appl. No. 10/704,497, filed Nov. 6, 2003.

Brask et al., "A Method for Etching a Thin Metal Layer", U.S. Appl. No. 10/704,498, filed Nov. 6, 2003.

Brask et al., "A Method for Making a Semiconductor Device with a Metal Gate Electrode that is Formed on an Annealed High-K Gate Dielectric Layer", U.S. Appl. No. 10/742,678, filed Dec. 19, 2003.

Brask et al., "A Method for Making a Semiconductor Device that includes a Metal Gate Electrode", U.S. Appl. No. 10/739,173, filed Dec. 18, 2003.

Brask et al., "A CMOS Device With Metal and Silicide Gate Electrodes and a Method for Making It", U.S. Appl. No. 10/748,559, filed Dec. 29, 2003.

Doczy et al., "A Method for Making a Semiconductor Device that Includes a Metal Gate Electrode", U.S. Appl. No. 10/748,545, filed Dec. 29, 2003.

* cited by examiner

REPLACEMENT GATE PROCESS FOR MAKING A SEMICONDUCTOR DEVICE THAT INCLUDES A METAL GATE ELECTRODE

FIELD OF THE INVENTION

The present invention relates to methods for making semiconductor devices, in particular, semiconductor devices with metal gate electrodes.

BACKGROUND OF THE INVENTION

When making a CMOS device that includes metal gate electrodes, a replacement gate process may be used to form gate electrodes from different metals. In that process, a first polysilicon layer, bracketed by a pair of spacers, is removed to create a trench between the spacers. The trench is filled with a first metal. A second polysilicon layer is then removed, and replaced with a second metal that differs from the first metal.

Current processes for etching polysilicon layers generate patterned polysilicon layers with side walls that are vertical or slightly inclined such that the lower surface of each patterned layer is wider than the upper surface. Although such a profile may be suitable for processes that retain the patterned polysilicon layers, it may be inappropriate for a replacement gate process, especially when making transistors with 45 nm or smaller gate lengths. After removing such a patterned polysilicon layer, it may be difficult to uniformly coat the sidewalls of the resulting trench with various materials. In addition, it may not be possible to completely fill such a trench with metal, as voids may form at the trench center.

Accordingly, there is a need for an improved method for making a semiconductor device that includes metal gate electrodes. There is a need for a method for generating a patterned polysilicon layer with a profile that is compatible with replacement gate processes for making transistors with very small gate lengths. The present invention provides such a method.

Features shown in these figures are not intended to be drawn to scale.

DETAILED DESCRIPTION OF THE PRESENT INVENTION

A method for making a semiconductor device is described. That method comprises forming a dielectric layer on a substrate, then forming a polysilicon layer on the dielectric layer. The polysilicon layer is then etched to generate a patterned polysilicon layer. That layer's upper surface is less than or equal to about 45 angstroms wide, and that layer's lower surface is less than or equal to about 40 angstroms wide. The upper surface is at least about 5 angstroms wider than the lower surface.

In the following description, a number of details are set forth to provide a thorough understanding of the present invention. It will be apparent to those skilled in the art, however, that the invention may be practiced in many ways other than those expressly described here. The invention is thus not limited by the specific details disclosed below.

Figure 1A:
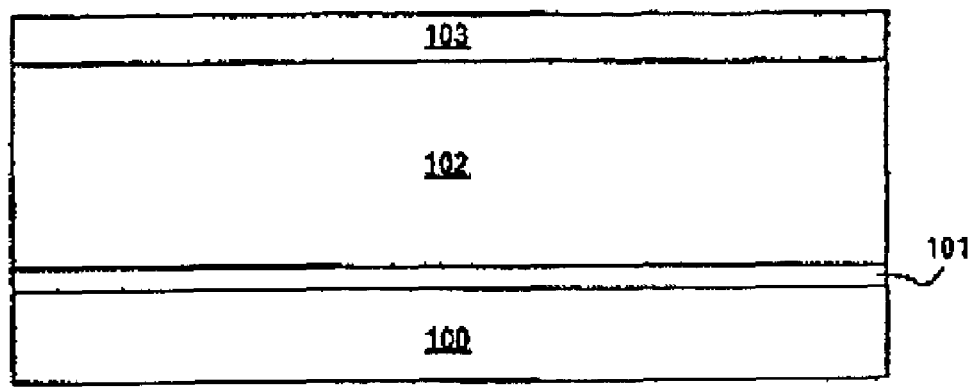
FIGS. 1A–1C represent cross-sections of structures that may be formed when carrying out an embodiment of the method of the present invention.
Figure 1B:
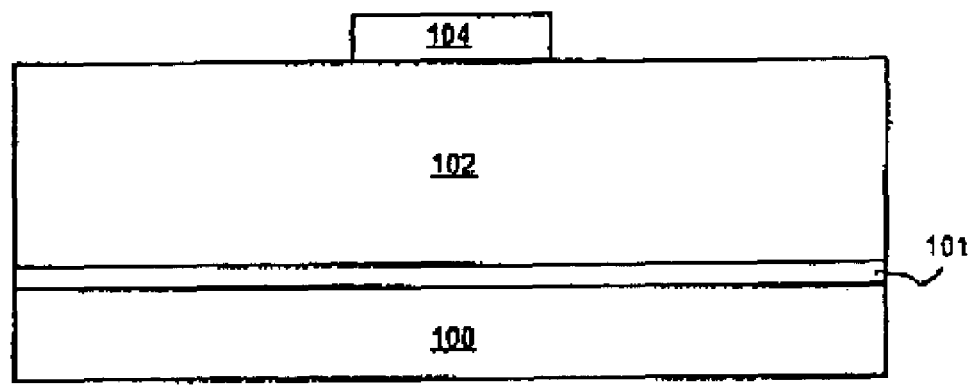
Figure 1C:
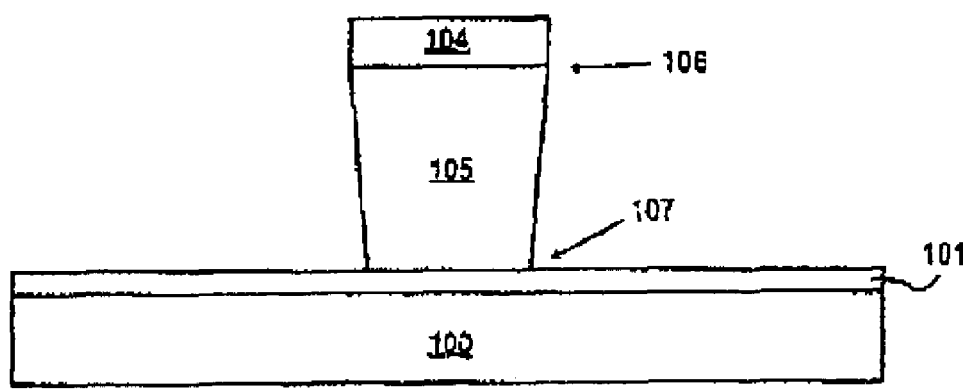

FIGS. 1A–1C illustrate structures that may be formed, when carrying out an embodiment of the method of the present invention. Initially, dielectric layer 101 is formed on substrate 100, polysilicon layer 102 is formed on dielectric layer 101, and masking layer 103 is formed on polysilicon layer 102, generating the FIG. 1A structure.

Substrate 100 may comprise a bulk silicon or silicon-on-insulator substructure. Alternatively, substrate 100 may comprise other materials—which may or may not be combined with silicon—such as: germanium, indium antimonide, lead telluride, indium arsenide, indium phosphide, gallium arsenide, or gallium antimonide. Although a few examples of materials from which substrate 100 may be formed are described here, any material that may serve as a foundation upon which a semiconductor device may be built falls within the spirit and scope of the present invention.

Dielectric layer 101 may comprise silicon dioxide, a nitrided silicon dioxide, a high-k dielectric layer, or other materials that may protect substrate 100. Polysilicon layer 102 preferably is between about 100 and about 2,000 angstroms thick, and more preferably is between about 500 and about 1,600 angstroms thick. Masking layer 103 preferably comprises silicon nitride, silicon dioxide, and/or silicon oxynitride, and preferably is between about 100 and about 500 angstroms thick. Dielectric layer 101, polysilicon layer 102, and masking layer 103 may be formed using conventional process steps.

After forming the FIG. 1A structure, the device may be transferred to a high density plasma etch tool, e.g., an electron cyclotron resonance etcher, and placed on a chuck that is positioned within the tool. The etch tool may then be operated to etch masking layer 103, generating hard mask 104 as FIG. 1B illustrates. Depending upon the material used to form masking layer 103, that layer may be etched by exposing it to a plasma that is derived from $C_4F_8$, argon and oxygen, or that is derived from $CH_3F$, carbon monoxide, and oxygen.

After forming hard mask 104, polysilicon layer 102 is etched to generate patterned polysilicon layer 105, as shown in FIG. 1C. Patterned polysilicon layer 105 has upper surface 106 and lower surface 107. The width of upper surface 106 is less than or equal to about 45 angstroms, the width of lower surface 107 is less than or equal to about 40 angstroms, and the width of upper surface 106 is at least about 5 angstroms greater than the width of lower surface 107. In a preferred embodiment, lower surface 107 meets dielectric layer 101 at an angle that is less than about 87°, but that is sufficiently wide to enable silicon nitride spacers to be formed on layer 105's sides.

Polysilicon layer 102 may be patterned by applying to it a plasma derived from the combination of chlorine, hydrogen bromide, oxygen, and argon for a sufficient time to remove the exposed part of that layer. If polysilicon layer 102 is etched while dielectric layer 101 is electrically charged, the inverted taper profile shown in FIG. 1C may result because a charged dielectric layer may promote a slightly faster etch rate at the lower part of layer 102 than occurs at the upper part of that layer. Dielectric layer 101 should be sufficiently thick to maintain an electric charge for substantially the entire time that polysilicon layer 102 is etched.

To ensure that dielectric layer 101 remains charged throughout the etch process, it may be necessary to control the RF bias power that is delivered to the etch tool's chuck during that operation. In a preferred embodiment, the RF bias power that is applied to the chuck as polysilicon layer 102 is etched is less than about 100 watts, and more preferably the applied RF bias power is less than 70 watts. It may be possible to obtain a satisfactory profile when RF bias power is delivered at 50 watts—or even lower power. The frequency at which RF bias power is applied to the chuck should be selected to ensure that dielectric layer 101 remains charged when polysilicon layer 102 is etched. The optimum RF bias power that is applied, and the optimum frequency at which it is delivered, may depend upon the particular etch tool that is used to etch layer 102.

Figure 2A:
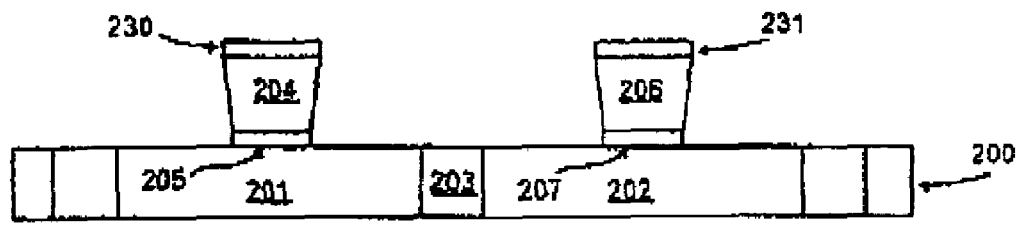
FIGS. 2A–2M represent cross-sections of structures that may be formed when carrying out an embodiment of the method of the present invention as applied to a replacement gate process.
Figure 2B:
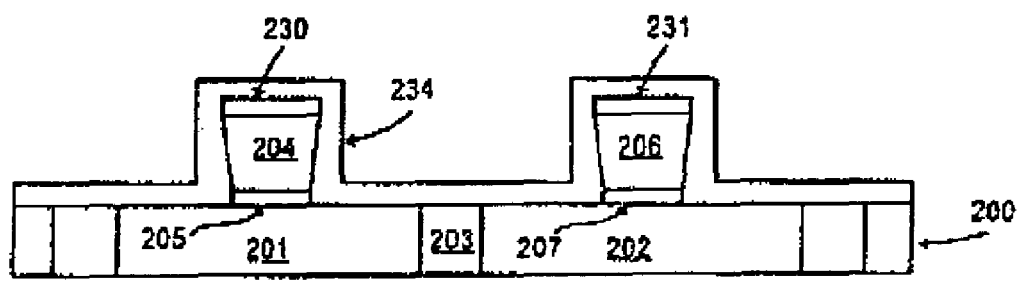

As demonstrated below, applying the method of the present invention to form a patterned polysilicon layer with such an inverted taper profile may enable one to form very small transistors that include metal gate electrodes using a replacement gate process. FIGS. 2A–2M illustrate structures that may be formed, when integrating the method of the present invention into such a process. FIG. 2A represents an intermediate structure that may be formed when making a CMOS device. That structure includes first part 201 and second part 202 of substrate 200. Isolation region 203 separates first part 201 from second part 202. Isolation region 203 may comprise silicon dioxide, or other materials that may separate the transistor's active regions.

In this embodiment, first polysilicon layer 204 is formed on first dummy dielectric layer 205, and second polysilicon layer 206 is formed on second dummy dielectric layer 207. Hard masks 230, 231 are formed on polysilicon layers 204, 206. First dummy dielectric layer 205 and second dummy dielectric layer 207 may each comprise silicon dioxide, or other materials that may protect substrate 200—e.g., silicon oxynitride, silicon nitride, a carbon doped silicon dioxide, or a nitrided silicon dioxide. Dummy dielectric layers 205, 207 preferably are sufficiently thick to maintain an electric charge for substantially the entire time that the polysilicon layer is etched.

As in the embodiment described above, polysilicon layers 204, 206 are preferably between about 100 and about 2,000 angstroms thick, and more preferably between about 500 and about 1,600 angstroms thick. Hard masks 230, 231 may comprise silicon nitride, silicon dioxide and/or silicon oxynitride, and preferably are between about 100 and about 500 angstroms thick. The process steps described above may be used to create patterned polysilicon layers 204, 206 that have an inverted taper profile. As illustrated below, it may be easier to coat and fill a trench, which results from removing layers with such an inverted taper profile, than to fill a trench, which results from removing layers that lack such a profile. After forming patterned polysilicon layers 204, 206, a conventional etch process may be applied to generate patterned dummy dielectric layers 205, 207.

After forming the FIG. 2A structure, spacers are formed on opposite sides of patterned polysilicon layers 204, 206. When those spacers comprise silicon nitride, they may be formed in the following way. First, a silicon nitride layer of substantially uniform thickness—preferably less than about 1000 angstroms thick—is deposited over the entire structure, producing the structure shown in FIG. 2B. Conventional deposition processes may be used to generate that structure.

In a preferred embodiment, silicon nitride layer 234 is deposited directly on substrate 200, hard masks 230, 231, and opposite sides of patterned polysilicon layers 204, 206—without first forming a buffer oxide layer on substrate 200 and layers 204, 206. In alternative embodiments, however, such a buffer oxide layer may be formed prior to forming layer 234. Similarly, although not shown in FIG. 2B, a second oxide may be formed on layer 234 prior to etching that layer. If used, such an oxide may enable the subsequent silicon nitride etch step to generate an L-shaped spacer.

Figure 2C:
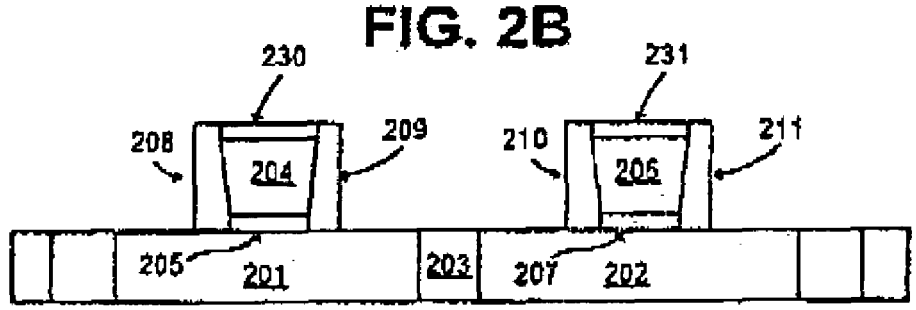

Silicon nitride layer 234 may be etched using a conventional process for anisotropically etching silicon nitride to create the FIG. 2C structure. When hard masks 230, 231 comprise silicon nitride, a timed etch may be used to prevent that anisotropic etch step from removing hard masks 230, 231, when silicon nitride layer 234 is etched. As a result of that etch step, patterned polysilicon layer 204 is bracketed by a pair of sidewall spacers 208, 209, and patterned polysilcon layer 206 is bracketed by a pair of sidewall spacers 210, 211.

As is typically done, it may be desirable to perform multiple masking and ion implantation steps to create lightly implanted regions near layers 204, 206 (that will ultimately serve as tip regions for the device's source and drain regions), prior to forming spacers 208, 209, 210, 211 on patterned polysilicon layers 204, 206. Also as is typically done, the source and drain regions may be formed, after forming spacers 208, 209, 210, 211, by implanting ions into parts 201 and 202 of substrate 200, followed by applying an appropriate anneal step.

An ion implantation and anneal sequence used to form n-type source and drain regions within part 201 of substrate 200 may dope patterned polysilicon layer 204 n-type at the same time. Similarly, an ion implantation and anneal sequence used to form p-type source and drain regions within part 202 of substrate 200 may dope patterned polysilicon layer 206 p-type. When doping patterned polysilicon layer 206 with boron, that layer should include that element at a sufficient concentration to ensure that a subsequent wet etch process, for removing n-type patterned polysilicon layer 204, will not remove a significant amount of p-type patterned polysilicon layer 206.

Dummy dielectric layers 205, 207 should be sufficiently thick to prevent a significant number of ions from penetrating through layers 204, 206 and layers 205, 207. Using relatively thick dummy dielectric layers may enable one to optimize the process used to implant ions into the source and drain regions without having to consider whether that process will drive too many ions into the channel. After the ion implantation and anneal steps, part of the source and drain regions may be converted to a silicide using well known process steps. Hard masks 230, 231 will prevent layers 204, 206 from being converted into a silicide, when forming a silicide in the source and drain regions.

Figure 2D:
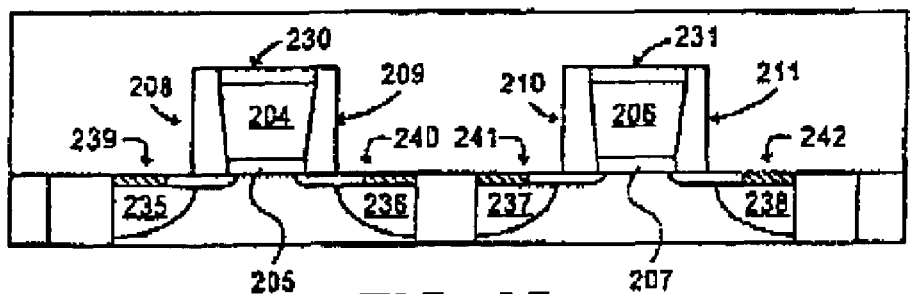

After forming spacers 208, 209, 210, 211, dielectric layer 212 may be deposited over the device, generating the FIG. 2D structure. Dielectric layer 212 may comprise silicon dioxide, or a low-k material. Dielectric layer 212 may be doped with phosphorus, boron, or other elements, and may be formed using a high density plasma deposition process. By this stage of the process, source and drain regions 235, 236, 237, 238, which are capped by silicided regions 239, 240, 241, 242, have already been formed. Conventional process steps, materials, and equipment may be used to generate those structures, as will be apparent to those skilled in the art.

Figure 2E:
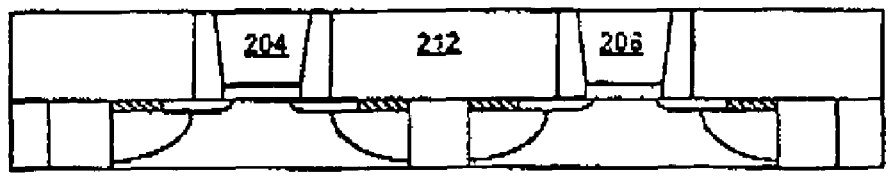

Dielectric layer 212 is removed from hard masks 230, 231, which are, in turn, removed from patterned polysilicon layers 204, 206, producing the FIG. 2E structure. A conventional chemical mechanical polishing ("CMP") operation may be applied to remove that part of dielectric layer 212, and hard masks 230, 231. Hard masks 230, 231 must be removed to expose patterned polysilicon layers 204, 206. Hard masks 230, 231 may be polished from the surface of layers 204, 206, when dielectric layer 212 is polished—as they will have served their purpose by that stage in the process.

Figure 2F:
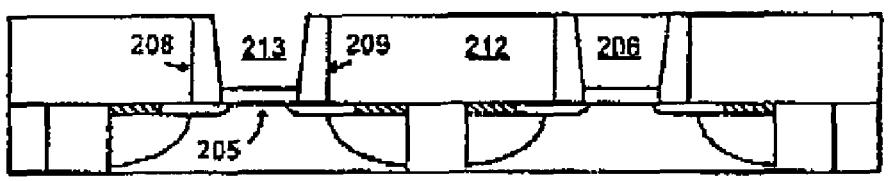
Figure 2G:
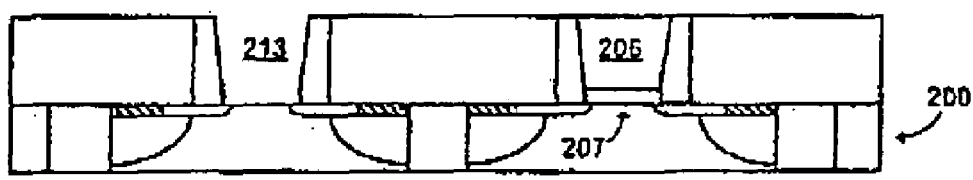

After forming the FIG. 2E structure, patterned polysilicon layer 204 is removed to generate trench 213 that is positioned between sidewall spacers 208, 209—producing the structure shown in FIG. 2F. In a preferred embodiment, a wet etch process that is selective for layer 204 over patterned polysilicon layer 206 is applied to remove layer 204 without removing significant portions of layer 206.

When patterned polysilicon layer 204 is doped n-type, and patterned polysilicon layer 206 is doped p-type (e.g., with boron), such a wet etch process may comprise exposing patterned polysilicon layer 204 to an aqueous solution that comprises a source of hydroxide for a sufficient time at a sufficient temperature to remove substantially all of layer 204. That source of hydroxide may comprise between about 2 and about 30 percent ammonium hydroxide or a tetraalkyl ammonium hydroxide, e.g., tetramethyl ammonium hydroxide ("TMAH"), by volume in deionized water.

Patterned polysilicon layer 204 may be selectively removed by exposing it to a solution, which is maintained at a temperature between about 15° C. and about 90° C. (and preferably below about 40° C.), that comprises between about 2 and about 30 percent ammonium hydroxide by volume in deionized water. During that exposure step, which preferably lasts at least one minute, it may be desirable to apply sonic energy at a frequency of between about 10 KHz and about 2,000 KHz, while dissipating at between about 1 and about 10 watts/cm$^2$.

In a particularly preferred embodiment, a patterned polysilicon layer with a thickness of about 1,350 angstroms may be selectively removed by exposing it at about 25° C. for about 30 minutes to a solution that comprises about 15 percent ammonium hydroxide by volume in deionized water, while applying sonic energy at about 1,000 KHz—dissipating at about 5 watts/cm$^2$. Such an etch process should remove substantially all of an n-type patterned polysilicon layer without removing a meaningful amount of a p-type patterned polysilicon layer.

As an alternative, patterned polysilicon layer 204 may be selectively removed by exposing it for at least one minute to a solution, which is maintained at a temperature between about 60° C. and about 90° C., that comprises between about 20 and about 30 percent TMAH by volume in deionized water, while applying sonic energy. Removing a patterned polysilicon layer with a thickness of about 1,350 angstroms by exposing it at about 80° C. for about 2 minutes to a solution that comprises about 25 percent TMAH by volume in deionized water (while applying sonic energy at about 1,000 KHz, dissipating at about 5 watts/cm$^2$) may remove substantially all of that layer without removing a significant amount of layer 206. First dummy dielectric layer 205 should be sufficiently thick to prevent the etchant that is applied to remove patterned polysilicon layer 204 from reaching the channel region that is located beneath first dummy dielectric layer 205.

When patterned polysilicon layer 204 is removed to form trench 213, the resulting trench is wider at the top than at the bottom because of patterned polysilicon layer 204's inverted taper profile. The sides of such a trench may be more uniformly coated than the sides of a trench that is narrower at the top than at the bottom. In addition, it may be easier to fill such a trench with metal, without void formation at the trench center, than to fill a trench that is narrower at the top than at the bottom:

After removing patterned polysilicon layer 204, first dummy dielectric layer 205 is removed. When first dummy dielectric layer 205 comprises silicon dioxide, it may be removed using an etch process that is selective for silicon dioxide to generate the FIG. 2G structure. Such etch processes include: exposing layer 205 to a solution that includes about 1 percent HF in deionized water, or applying a dry etch process that employs a fluorocarbon based plasma. Layer 205 should be exposed for a limited time, as the etch process for removing layer 205 may also remove part of dielectric layer 212.

Figure 2H:
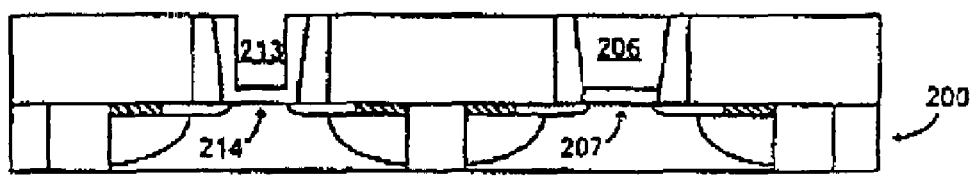

After removing first dummy dielectric layer 205, gate dielectric layer 214 is formed on substrate 200 at the bottom of trench 213, generating the FIG. 2H structure. Although gate dielectric layer 214 may comprise any material that may serve as a gate dielectric for an NMOS transistor that includes a metal gate electrode, gate dielectric layer 214 preferably comprises a high-k dielectric material. Some of the materials that may be used to make high-k gate dielectric 214 include: hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, and aluminum oxide. Although a few examples of materials that may be used to form high-k gate dielectric layer 214 are described here, that layer may be made from other materials.

High-k gate dielectric layer 214 may be formed on substrate 200 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 200 and high-k gate dielectric layer 214. The CVD reactor should be operated long enough to form a layer with the desired thickness. In most applications, high-k gate dielectric layer 214 should be less than about 60 angstroms thick, and more preferably between about 5 angstroms and about 40 angstroms thick.

As shown in FIG. 2H, when an atomic layer CVD process is used to form high-k gate dielectric layer 214, that layer will form on the sides of trench 213 in addition to forming on the bottom of that trench. If high-k gate dielectric layer 214 comprises an oxide, it may manifest oxygen vacancies at random surface sites and unacceptable impurity levels, depending upon the process used to make it. It may be desirable to remove impurities from layer 214, and to oxidize it to generate a layer with a nearly idealized metal: oxygen stoichiometry, after layer 214 is deposited.

To remove impurities from that layer and to increase that layer's oxygen content, a wet chemical treatment may be applied to high-k gate dielectric layer 214. Such a wet chemical treatment may comprise exposing high-k gate dielectric layer 214 to a solution that comprises hydrogen peroxide at a sufficient temperature for a sufficient time to remove impurities from high-k gate dielectric layer 214 and to increase the oxygen content of high-k gate dielectric layer 214. The appropriate time and temperature at which high-k gate dielectric layer 214 is exposed may depend upon the desired thickness and other properties for high-k gate dielectric layer 214.

When high-k gate dielectric layer 214 is exposed to a hydrogen peroxide based solution, an aqueous solution that contains between about 2% and about 30% hydrogen peroxide by volume may be used. That exposure step should take place at between about 15° C. and about 40° C. for at least about one minute. In a particularly preferred embodiment, high-k gate dielectric layer 214 is exposed to an aqueous solution that contains about 6.7% $H_2O_2$ by volume for about 10 minutes at a temperature of about 25° C. During that exposure step, it may be desirable to apply sonic energy at a frequency of between about 10 KHz and about 2,000 KHz, while dissipating at between about 1 and about 10 watts/cm$^2$. In a preferred embodiment, sonic energy may be applied at a frequency of about 1,000 KHz, while dissipating at about 5 watts/cm$^2$.

Although not shown in FIG. 2H, it may be desirable to form a capping layer, which is no more than about five monolayers thick, on high-k gate dielectric layer 214. Such a capping layer may be formed by sputtering one to five monolayers of silicon, or another material, onto the surface of high-k gate dielectric layer 214. The capping layer may then be oxidized, e.g., by using a plasma enhanced chemical vapor deposition process or a solution that contains an oxidizing agent, to form a capping dielectric oxide.

Figure 2I:
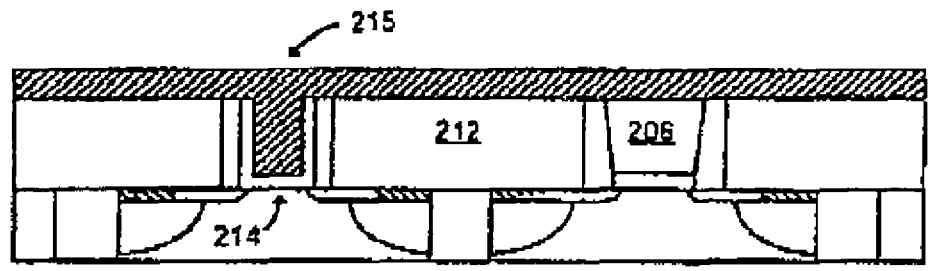
Figure 2J:
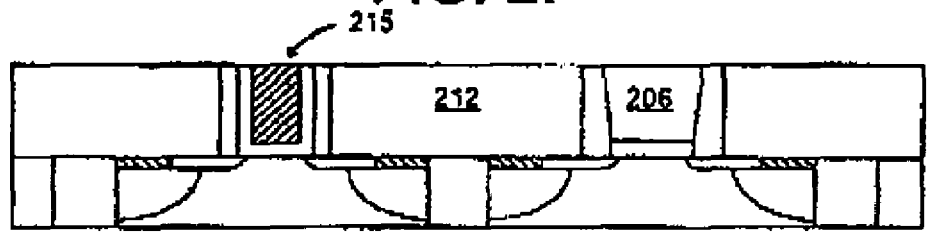

Although in some embodiments it may be desirable to form a capping layer on gate dielectric layer 214, in the illustrated embodiment, n-type metal layer 215 is formed directly on layer 214 to fill trench 213 and to generate the FIG. 2I structure. N-type metal layer 215 may comprise any n-type conductive material from which a metal NMOS gate electrode may be derived. Materials that may be used to form n-type metal layer 215 include: hafnium, zirconium, titanium, tantalum, aluminum, and their alloys, e.g., metal carbides that include these elements, i.e., hafnium carbide, zirconium carbide, titanium carbide, tantalum carbide, and aluminum carbide. N-type metal layer 215 may be formed on high-k gate dielectric layer 214 using well known PVD or CVD processes, e.g., conventional sputter or atomic layer CVD processes. As shown in FIG. 2J, n-type metal layer 215 is removed except where it fills trench 213. Layer 215 may be removed from other portions of the device via a wet or dry etch process, or an appropriate CMP operation. Dielectric 212 may serve as an etch or polish stop, when layer 215 is removed from its surface.

N-type metal layer 215 preferably serves as a metal NMOS gate electrode that has a workfunction that is between about 3.9 eV and about 4.2 eV, and that is between about 100 angstroms and about 2,000 angstroms thick, and more preferably is between about 500 angstroms and about 1,600 angstroms thick. Although FIGS. 2I and 2J represent structures in which n-type metal layer 215 fills all of trench 213, in alternative embodiments, n-type metal layer 215 may fill only part of trench 213, with the remainder of the trench being filled with a material that may be easily polished, e.g., tungsten, aluminum, titanium, or titanium nitride. In such an alternative embodiment, n-type metal layer 215, which serves as the workfunction metal, may be between about 50 and about 1,000 angstroms thick—and more preferably at least about 100 angstroms thick.

In embodiments in which trench 213 includes both a workfunction metal and a trench fill metal, the resulting metal NMOS gate electrode may be considered to comprise the combination of both the workfunction metal and the trench fill metal. If a trench fill metal is deposited on a workfunction metal, the trench fill metal may cover the entire device when deposited, forming a structure like the FIG. 2I structure. That trench fill metal must then be polished back so that it fills only the trench, generating a structure like the FIG. 2J structure.

Figure 2K:
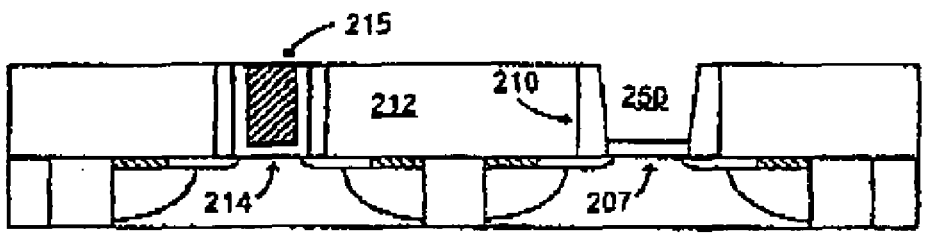

In the illustrated embodiment, after forming n-type metal layer 215 within trench 213, patterned polysilicon layer 206 is removed to generate trench 250 that is positioned between sidewall spacers 210, 211—producing the structure shown in FIG. 2K. In a preferred embodiment, layer 206 is exposed to a solution that comprises between about 20 and about 30 percent TMAH by volume in deionized water for a sufficient time at a sufficient temperature (e.g., between about 60° C. and about 90° C.), while applying sonic energy, to remove all of layer 206 without removing significant portions of n-type metal layer 215.

Second dummy dielectric layer 207 may be removed and replaced with gate dielectric layer 260, using process steps like those identified above. Gate dielectric layer 260 preferably comprises a high-k gate dielectric layer. Optionally, as mentioned above, a capping layer (which may be oxidized after it is deposited) may be formed on gate dielectric layer 260 prior to filling trench 250 with a p-type metal. In this embodiment, however, after replacing layer 207 with layer 260, p-type metal layer 216 is formed directly on layer 260 to fill trench 250 and to generate the FIG. 2L structure. P-type metal layer 216 may comprise any p-type conductive material from which a metal PMOS gate electrode may be derived.

Materials that may be used to form p-type metal layer 216 include: ruthenium, palladium, platinum, cobalt, nickel, and conductive metal oxides, e.g., ruthenium oxide. P-type metal layer 216 may be formed on gate dielectric layer 260 using well known PVD or CVD processes, e.g., conventional sputter or atomic layer CVD processes. As shown in FIG. 2M, p-type metal layer 216 is removed except where it fills trench 250. Layer 216 may be removed from other portions of the device via a wet or dry etch process, or an appropriate CMP operation, with dielectric 212 serving as an etch or polish stop. P-type metal layer 216 may serve as a metal PMOS gate electrode with a workfunction that is between about 4.9 eV and about 5.2 eV, and that is between about 100 angstroms and about 2,000 angstroms thick, and more preferably is between about 500 angstroms and about 1,600 angstroms thick.

Figure 2L:
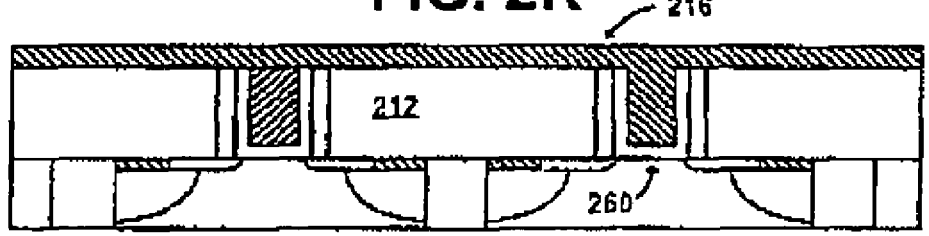
Figure 2M:
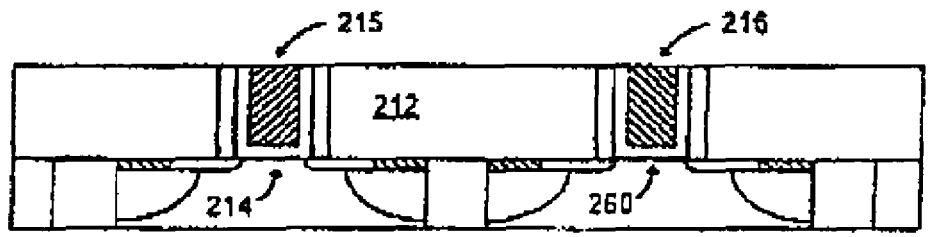

Although FIGS. 2L and 2M represent structures in which p-type metal layer 216 fills all of trench 250, in alternative embodiments, p-type metal layer 216 may fill only part of trench 250. As with the metal NMOS gate electrode, the remainder of the trench may be filled with a material that may be easily polished, e.g., tungsten, aluminum, titanium, or titanium nitride. In such an alternative embodiment, p-type metal layer 216, which serves as the workfunction metal, may be between about 50 and about 1,000 angstroms thick. Like the metal NMOS gate electrode, in embodiments in which trench 250 includes a workfunction metal and a trench fill metal, the resulting metal PMOS gate electrode may be considered to comprise the combination of both the workfunction metal and the trench fill metal.

Although a few examples of materials that may be used to form dummy dielectric layers 205, 207 and metal layers 215 and 216 are described here, those dummy dielectric layers and those metal layers may be made from many other materials, as will be apparent to those skilled in the art. Although this embodiment illustrates forming a metal NMOS gate electrode prior to forming a metal PMOS gate electrode, alternative embodiments may form a metal PMOS gate electrode prior to forming a metal NMOS gate electrode.

After removing metal layer 216, except where it fills trench 250, a capping dielectric layer (not shown) may be deposited onto dielectric layer 212, metal NMOS gate electrode 215, and metal PMOS gate electrode 216, using any conventional deposition process. Process steps for completing the device that follow the deposition of such a capping dielectric layer, e.g., forming the device's contacts, metal interconnect, and passivation layer, are well known to those skilled in the art and will not be described here.

The method described above may enable narrow trenches to be formed whose sides may be uniformly coated with selected materials, and that may be completely filled with metal without voids being created in their centers. Although the embodiments described above provide examples of processes for forming devices that include such trenches, the present invention is not limited to these particular embodiments.

Although the foregoing description has specified certain steps and materials that may be used in the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a semiconductor device comprising:
    forming a dielectric layer on a substrate;
    forming a polysilicon layer on the dielectric layer; and
    etching the polysilicon layer to generate a patterned polysilicon layer that has an upper surface, a lower surface, and at least one sidewall, the upper surface having a first width that is less than or equal to about 45 angstroms, the lower surface having a second width that is less than or equal to about 40 angstroms, and the sidewall meeting a plane of the dielectric layer at an angle that is less than about 87 degrees but sufficiently wide to enable a spacer to be formed on the sidewall;
    wherein the first width is at least about 5 angstroms greater than the second width.

2. The method of claim 1 further comprising placing the substrate, after it is covered with the dielectric layer and the polysilicon layer, on a chuck that is positioned within a high density plasma etch tool prior to etching the polysilicon layer.

3. The method of claim 2 wherein the dielectric layer is electrically charged when the polysilicon layer is etched.

4. The method of claim 3 wherein the dielectric layer comprises a material that is selected from the group consisting of silicon dioxide and a nitrided silicon dioxide and is sufficiently thick to maintain an electric charge for substantially the entire time that the polysilicon layer is etched, the polysilicon layer is between about 100 and about 2,000 angstroms thick, and the polysilicon layer is etched by exposing the polysilicon layer to a plasma derived from chlorine, hydrogen bromide, oxygen, and argon.

5. The method of claim 4 wherein RE bias power of less than about 100 watts is applied to the chuck as the polysilicon layer is etched.

6. The method of claim 1 further comprising forming a masking layer on the polysilicon layer prior to etching the polysilicon layer.

7. The method of claim 6 wherein the masking layer is created at least in part by forming a silicon nitride layer that is between about 100 angstroms and about 500 angstroms thick on the polysilicon layer, then etching the silicon nitride layer by exposing that layer to a plasma.

8. The method of claim 1 wherein the dielectric layer is a high-k dielectric layer.

9. A method for making a semiconductor device comprising:
    forming a silicon dioxide layer on a substrate;
    forming on the silicon dioxide layer a polysilicon layer that is between about 100 and about 2,000 angstroms thick;
    forming a first silicon nitride layer that is between about 100 angstroms and about 500 angstroms thick on the polysilicon layer;
    etching the first silicon nitride layer to create a hard mask; and
    etching the polysilicon layer to generate a patterned polysilicon layer that has an upper surface, a lower surface, and at least one sidewall, the upper surface having a first width that is less than or equal to about 45 angstroms, the lower surface having a second width that is less than or equal to about 40 angstroms, and the sidewall meeting a plane of the silicon dioxide layer at an angle that is less than about 87 degrees but sufficiently wide to enable a spacer to be formed on the sidewall;
    wherein the first width is at least about 5 angstroms greater than the second width.

10. The method of claim 9 further comprising:
    etching the silicon dioxide layer after the polysilicon layer is etched to generate a patterned silicon dioxide layer;
    depositing a second silicon nitride layer on the substrate, the hard mask, and the patterned polysilicon layer;
    removing the second silicon nitride layer from part of the substrate to form first and second spacers on opposite sides of the patterned polysilicon layer;
    removing the hard mask, the patterned polysilicon layer, and the patterned silicon dioxide layer to generate a trench that is positioned between the first and second spacers;
    forming a high-k gate dielectric layer on the substrate at the bottom of the trench; and
    filling at least part of the trench with a metal layer that is formed on the high-k gate dielectric layer.

11. The method of claim 10 wherein: the high-k gate dielectric layer comprises a material that is selected from the group consisting of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate; and
    the metal layer fills the entire trench and comprises a material that is selected from the group consisting of hafnium, zirconium, titanium, tantalum, aluminum, a metal carbide, ruthenium, palladium, platinum, cobalt, nickel, and a conductive metal oxide.

12. The method of claim 10 further comprising:
    forming a dielectric layer on the hard mask and the substrate after forming the first and second spacers;
    applying a chemical mechanical polishing process to remove the dielectric layer from the hard mask prior to removing the hard mask, the patterned polysilicon layer, and the patterned silicon dioxide layer to generate the trench;

filling only part of the trench with a workfunction metal that is between about 50 and about 1,000 angstroms thick; and forming on the workfunction metal a trench fill metal that is selected from the group consisting of tungsten, aluminum, titanium, and titanium nitride.

13. The method of claim 9 wherein the metal layer comprises a material that is selected from the group consisting of hafnium, zirconium, titanium, tantalum, aluminum, and a metal carbide, and has a workfunction that is between about 3.9 eV and about 4.2 eV.

14. The method of claim 9 wherein the metal layer comprises a material that is selected from the group consisting of ruthenium, palladium, platinum, cobalt, nickel, and a conductive metal oxide, and has a workfunction that is between about 4.9 eV and about 5.2 eV.

15. A method for making a semiconductor device comprising:

forming a nitrided silicon dioxide layer on a substrate;

forming on the nitrided silicon dioxide layer a polysilicon layer that is between about 100 and about 2,000 angstroms thick;

forming a first silicon nitride layer that is between about 100 and about 500 angstroms thick on the polysilicon layer;

etching the first silicon nitride layer, the polysilicon layer, and the nitrided silicon dioxide layer, to form a hard mask, a patterned polysilicon layer, and a patterned nitrided silicon dioxide layer, wherein a sidewall of the patterned polysilicon layer meets a plane of the patterned nitrided silicon dioxide layer at an angle that is less than about 87 degrees but sufficiently wide to enable a spacer to be formed on the sidewall;

depositing a second silicon nitride layer on the substrate, the hard mask and on opposite sides of the patterned polysilicon layer;

removing the second silicon nitride layer from part of the substrate and from the hard mask to form first and second spacers on opposite sides of the patterned polysilicon layer;

forming a dielectric layer on the hard mask and on the substrate;

removing the dielectric layer from the hard mask;

removing the hard mask, the patterned polysilicon layer and the patterned nitrided silicon dioxide layer to generate a trench that is positioned between the first and second spacers;

forming a high-k gate dielectric layer on the substrate at the bottom of the trench; and filling at least part of the trench with a metal layer that is formed on the high-k gate dielectric layer;

wherein the nitrided silicon dioxide layer maintains an electric charge for substantially the entire time that the polysilicon layer is etched.

16. The method of claim 15 wherein the patterned polysilicon layer has an upper surface and a lower surface, the upper surface having a first width that is less than or equal to about 45 angstroms, the lower surface having a second width that is less than or equal to about 40 angstroms, and the first width being at least about 5 angstroms greater than the second width.

17. The method of claim 15 wherein:

the high-k gate dielectric layer comprises a material that is selected from the group consisting of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate; and the metal layer fills the entire trench and comprises a material that is selected from the group consisting of hafnium, zirconium, titanium, tantalum, aluminum, a metal carbide, ruthenium, palladium, platinum, cobalt, nickel, and a conductive metal oxide.

18. The method of claim 15 wherein the metal layer comprises a material that is selected from the group consisting of hafnium, zirconium, titanium, tantalum, aluminum, and a metal carbide, and has a workfunction that is between about 3.9 eV and about 4.2 eV.

19. The method of claim 15 wherein the metal layer comprises a material that is selected from the group consisting of ruthenium, palladium, platinum, cobalt, nickel, and a conductive metal oxide, and has a workfunction that is between about 4.9 eV and about 5.2 eV.

20. The method of claim 15 wherein:

a chemical mechanical polishing process is used to remove the dielectric layer from the hard mask; and the metal layer serves as a workfunction metal that fills only part of the trench and is between about 50 and about 1,000 angstroms thick; and further comprising forming on the metal layer a trench fill metal that is selected from the group consisting of tungsten, aluminum, titanium, and titanium nitride.

* * * * *